United States Patent
Huang et al.

(10) Patent No.: US 8,834,003 B2
(45) Date of Patent: Sep. 16, 2014

(54) DISPLAY APPARATUS

(71) Applicant: E Ink Holdings, Inc., Hsinchu (TW)

(72) Inventors: Hsin-Tao Huang, Hsinchu (TW); I-Jeng Chen, Hsinchu (TW); Yu-Nan Pao, Hsinchu (TW); Yu-Nan Tsao, Hsinchu (TW); Chin-Ju Hsu, Hsinchu (TW); Sheng-Chieh Tai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/921,194

(22) Filed: Jun. 18, 2013

(65) Prior Publication Data

US 2014/0070237 A1    Mar. 13, 2014

(30) Foreign Application Priority Data

Sep. 12, 2012 (TW) .............................. 101133365 A (51) Int. Cl.
*F21V 7/04* (2006.01)
(52) U.S. Cl.
USPC ............ 362/612; 362/613; 362/615; 362/616
(58) Field of Classification Search
USPC .................................. 362/612, 613, 615, 616
See application file for complete search history.

(56) References Cited

U.S. PATENT DOCUMENTS

| | | |
|---|---|---|
| 6,474,826 B1 | 11/2002 | Tanaka et al. |
| 6,636,283 B2 | 10/2003 | Sasagawa et al. |
| 6,788,358 B1 | 9/2004 | Kim et al. |
| 6,940,570 B1 | 9/2005 | Sumida et al. |
| 7,040,796 B2 | 5/2006 | Sugiura et al. |
| 7,163,331 B2 | 1/2007 | Suzuki et al. |
| 7,275,853 B2 | 10/2007 | Kano et al. |
| 7,314,303 B2 | 1/2008 | Tsuda |
| 7,850,357 B2 | 12/2010 | Kim et al. |
| 8,235,573 B2 * | 8/2012 | Chang .......................... 362/610 |
| 2009/0168459 A1 | 7/2009 | Holman et al. |
| 2012/0106200 A1 | 5/2012 | Yin et al. |
| 2012/0170312 A1 * | 7/2012 | Lee ............................... 362/612 |
| 2012/0243257 A1 * | 9/2012 | Nam et al. .................... 362/609 |

* cited by examiner

*Primary Examiner* — Evan Dzierzynski
(74) *Attorney, Agent, or Firm* — Jianq Chyun IP Office (57) ABSTRACT

A display apparatus includes a display panel, a light guide plate, point light sources, a passivation layer and a first light adjusting layer. The light guide plate is disposed above the display panel and has an upper surface, an opposite lower surface, a light incident surface, a first and a second light guiding blocks. The display panel is disposed corresponding to the first light guiding block, and the second light guiding block extends outside the display panel. A portion of the upper surface located on the first light guiding block is an even surface. The first light guiding block is located between the passivation layer and the display panel. The first light adjusting layer is disposed on the second light guiding block and located on the upper surface or the lower surface. There is a first rough interface between the first light adjusting layer and the light guide plate.

20 Claims, 5 Drawing Sheets

DISPLAY APPARATUS

CROSS-REFERENCE TO RELATED APPLICATION

This application claims the priority benefit of Taiwan application serial no. 101133365, filed on Sep. 12, 2012. The entirety of the above-mentioned patent application is hereby incorporated by reference herein and made a part of this specification.

BACKGROUND OF THE INVENTION

1. Field of the Invention

The invention relates to a display apparatus, and more particularly, to a display apparatus having a better display quality.

2. Description of Related Art

With the development of flat panel display technology, liquid crystal displays (LCD) have increasingly become the mainstream of display technology, and have replaced conventional cathode ray tubes (CRT) for being widely used in daily life. Since a liquid crystal panel in the LCD cannot emit light, a backlight module is required to provide a backlight source. According to a placement position of a light emitting device, the backlight module may be divided into a direct type backlight module and a side type backlight module, wherein the side type backlight module is capable of guiding light from a side surface to a front side to form a surface light source by having a light guide plate.

In the side type backlight module, the light emitting device, for example, a cold cathode fluorescent lamp (CCFL), is disposed on a light incident surface on a side edge of the light guide plate. After passing through the light incident surface and entering the light guide plate, light from the CCFL is converted into the surface light source by the light guide plate, and is output from the light guide plate via an upper surface of the light guide plate. With breakthroughs in manufacturing technology, a light emitting diode (LED) increasingly replaces the CCFL to be used as the light emitting device in the backlight module. In prior art designs, a plurality of LEDs is arranged beside the light incident surface of the light guide plate with intervals. However, as a point light source, the light intensity of the plurality of LEDs on the light incident surface is not uniformly distributed, wherein bright regions are formed on positions corresponding to the LEDs, and a dark region is formed between two LEDs, so that the surface light source output by the light guide plate generates mura along an extending direction of the upper surface. In other words, conventionally, during practical application, the side type backlight module employing the LED as the light emitting device has a problem of non-uniform light emergence, thereby relatively lowering display quality of the LCD.

SUMMARY OF THE INVENTION

The invention provides a display apparatus having a better display quality.

The invention proposes a display apparatus including a display panel, a light guide plate, a plurality of point light sources, a passivation layer and a first light adjusting layer. The light guide plate is disposed above the display panel and has an upper surface, an opposite lower surface, a light incident surface connecting the upper surface and the lower surface, a first light guiding block and a second light guiding block. The display panel is disposed corresponding to the first light guiding block, and the second light guiding block extends outside the display panel. A portion of the upper surface located on the first light guiding block is an even surface. The point light sources are disposed beside the light incident surface of the light guide plate. The passivation layer is disposed above the light guide plate, wherein the first light guiding block of the light guide plate is located between the passivation layer and the display panel. The first light adjusting layer is disposed on the second light guiding block of the light guide plate and located on the upper surface or the lower surface of the light guide plate. There is a first rough interface between the first light adjusting layer and the light guide plate.

In an embodiment of the invention, the display panel includes a reflective display panel.

In an embodiment of the invention, each of the point light sources is a light emitting diode.

In an embodiment of the invention, the first light adjusting layer includes a light absorbing layer or a light reflecting layer.

In an embodiment of the invention, the light absorbing layer includes a dielectric film layer, a black plastic material layer or a black coating layer, and the light absorbing layer has a light absorption rate greater than 60%.

In an embodiment of the invention, the light reflecting layer includes a dielectric film layer, a white plastic material layer, a white coating layer or a metal layer, and the light reflecting layer has a light reflection rate greater than 60%.

In an embodiment of the invention, a surface of the first light adjusting layer facing the light guide plate is a rough surface so that there is the first rough interface between the first light adjusting layer and the light guide plate.

In an embodiment of the invention, a portion of the upper surface or the lower surface of the light guide plate located on the second light guiding block is a rough surface so that there is the first rough interface between the first light adjusting layer and the light guide plate.

In an embodiment of the invention, the display apparatus further includes a first adhesive layer disposed between the display panel and the light guide plate.

In an embodiment of the invention, the display apparatus further includes a second adhesive layer disposed between the light guide plate and the passivation layer.

In an embodiment of the invention, the display apparatus further includes an optical film disposed between the light guide plate and the passivation layer.

In an embodiment of the invention, the display apparatus further includes a third adhesive layer disposed between the first light adjusting layer and the light guide plate.

In an embodiment of the invention, the display apparatus further includes a second light adjusting layer disposed on the second light guiding block of the light guide plate. One of the first light adjusting layer and the second light adjusting layer is disposed on the upper surface of the light guide plate, and the other is disposed on the lower surface of the light guide plate.

In an embodiment of the invention, the second light adjusting layer includes a light absorbing layer or a light reflecting layer.

In an embodiment of the invention, the light absorbing layer includes a dielectric film layer, a black plastic material layer or a black coating layer, and the light absorbing layer has a light absorption rate greater than 60%.

In an embodiment of the invention, the light reflecting layer includes a dielectric film layer, a white plastic material layer, a white coating layer or a metal layer, and the light reflecting layer has a light reflection rate greater than 60%.

In an embodiment of the invention, there is a second rough interface between the second light adjusting layer and the light guide plate.

In an embodiment of the invention, a surface of the second light adjusting layer facing the light guide plate is a rough surface so that there is the second rough interface between the second light adjusting layer and the light guide plate.

In an embodiment of the invention, a portion of the upper surface or the lower surface of the light guide plate located on the second light guiding block is a rough surface so that there is the second rough interface between the second light adjusting layer and the light guide plate.

In an embodiment of the invention, the display apparatus further includes a fourth adhesive layer disposed between the second light adjusting layer and the light guide plate.

Based on the above, the light guide plate of the invention has the second light guiding block extending outside the display panel, and the first light adjusting layer is located on the second light guiding block. Accordingly, when the point light source enters the light guide plate from the light incident surface of the light guide plate, the first light adjusting layer adjusts the light of the point light source in advance to cause the light entering the display panel to be more uniform. Moreover, since there is the rough interface between the first light adjusting layer and the light guide plate, the light from the point light source entering the light guide plate is effectively scattered to cause the light entering the display panel to be more uniform. Therefore, the display apparatus of the invention has a better display quality, and moreover, a combination design of the light guide plate and the first light adjusting layer effectively reduces the situations where a bright band appears at the light incident surface.

To make the aforementioned features and advantages of the invention more comprehensible, embodiments accompanied with figures are described in detail below.

DESCRIPTION OF EMBODIMENTS

Figure 1:
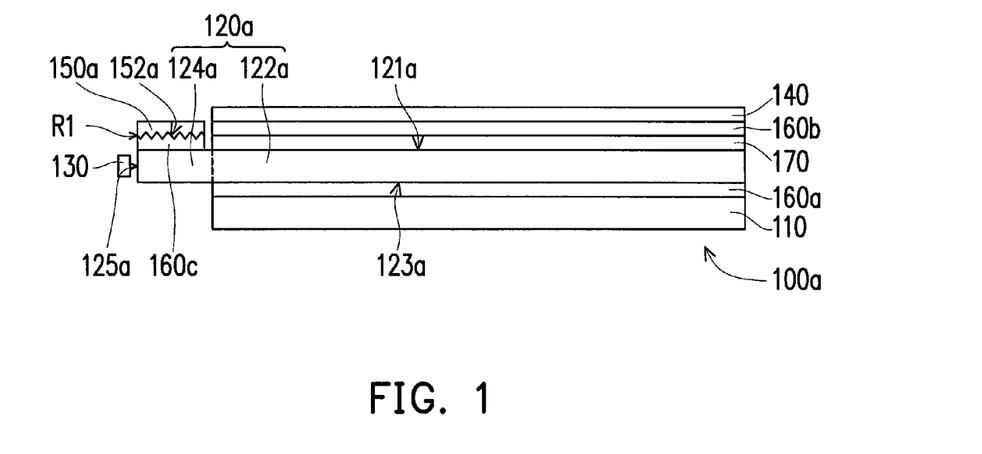
FIG. 1 illustrates a schematic cross-sectional view of a display apparatus according to an embodiment of the invention.

FIG. 1 illustrates a schematic cross-sectional view of a display apparatus according to an embodiment of the invention. Referring to FIG. 1, in the present embodiment, a display apparatus 100a includes a display panel 110, a light guide plate 120a, a plurality of point light sources 130, a passivation layer 140 and a first light adjusting layer 150a. In detail, the light guide plate 120a is disposed above the display panel 110 and has an upper surface 121a, an opposite lower surface 123a, a light incident surface 125a connecting the upper surface 121a and the lower surface 123a, a first light guiding block 122a and a second light guiding block 124a. The display panel 110 is disposed corresponding to the first light guiding block 122a, and the second light guiding block 124a extends outside the display panel 110. A portion of the upper surface 121a located on the first light guiding block 122a is an even surface. The point light sources 130 are disposed beside the light incident surface 125a of the light guide plate 120a. The passivation layer 140 is disposed above the light guide plate 120a, wherein the first light guiding block 122a of the light guide plate 120a is located between the passivation layer 140 and the display panel 110. The first light adjusting layer 150a is disposed on the second light guiding block 124a of the light guide plate 120a and located on the upper surface 121a of the light guide plate 120a. There is a first rough interface R1 between the first light adjusting layer 150a and the light guide plate 120a.

More specifically, the display panel 110 of the present embodiment is, for example, a reflective display panel, and the point light sources 130 are, for example, light emitting diodes. The first light adjusting layer 150a is a light absorbing layer, wherein the light absorbing layer is, for example, a dielectric film layer, a color plastic material layer such as a black PET layer, or a color coating layer such as a black coating layer. The light absorbing layer has a light absorption rate greater than 60%. Moreover, a surface of the first light adjusting layer 150a facing the light guide plate 120a is a rough surface 152a so that there is the first rough interface R1 between the first light adjusting layer 150a and the light guide plate 120a. Here, an average center line roughness (Ra) of the rough surface 152a is in a range of 1 μm to 500 μm.

In addition, the display apparatus 100a of the present embodiment further includes a first adhesive layer 160a, a second adhesive layer 160b and a third adhesive layer 160c. The first adhesive layer 160a is disposed between the display panel 110 and the first light guiding block 122a of the light guide plate 120a to attach and fix the display panel 110 onto the light guide plate 120a. The second adhesive layer 160b is disposed between the first light guiding block 122a of the light guide plate 120a and the passivation layer 140 to attach and fix the passivation layer 140 onto the light guide plate 120a. The third adhesive layer 160c is disposed between the first light adjusting layer 150a and the second light guiding block 124a of the light guide plate 120a to attach and fix the first light adjusting layer 150a onto the light guide plate 120a. As shown in FIG. 1, the third adhesive layer 160c and the second adhesive layer 160b are not connected to each other, and the first light adjusting layer 150a does not contact the second adhesive layer 160b and the passivation layer 140. To further enhance the display quality of the display apparatus 100a, the display apparatus 100a further includes an optical film 170, wherein the optical film 170 is disposed between the first light guiding block 122a of the light guide plate 120a and the passivation layer 140. The optical film 170 and the first light adjusting layer 150a are not connected to each other. The optical film 170 is, for example, a diffusion film, a brightness enhancement film, a prism film, or a combination thereof. The invention is not limited thereto.

The light guide plate 120a of the invention has the second light guiding block 124a extending outside the display panel 110, and the first light adjusting layer 150a is located on the second light guiding block 124a. Accordingly, when the point light source 130 enters the light guide plate 120a from the light incident surface 125a of the light guide plate 120a, the first light adjusting layer 150a and the first rough interface R1 adjust (such as absorb and scatter) the light of the point light source 130 in advance to cause the light entering the display panel 110 to be more uniform. Moreover, since there is the first rough interface R1 between the first light adjusting layer 150a and the light guide plate 120a, the light from the point light source 130 entering the light guide plate 120a is effectively scattered to cause the light entering the display panel 110 to be more uniform, and further to improve the illumination uniformity of the light guide plate 120a. Therefore, the display apparatus 100a of the present embodiment has a better display quality, and moreover, a combination design of the light guide plate 120a and the first light adjusting layer 150a effectively reduces the situations where a bright band appears at the light incident surface 125a of the light guide plate 120a.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
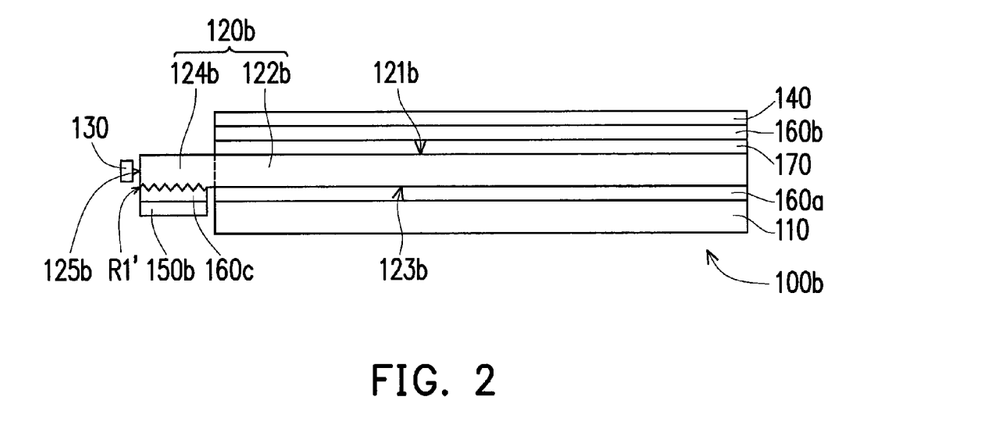
FIG. 2 illustrates a schematic cross-sectional view of a display apparatus according to another embodiment of the invention.

FIG. 2 illustrates a schematic cross-sectional view of a display apparatus according to another embodiment of the invention. Referring to both FIG. 1 and FIG. 2, a display apparatus 100b of the present embodiment is similar to the display apparatus 100a in FIG. 1. However, the two are different mainly in that a first light adjusting layer 150b of the present embodiment is disposed on a lower surface 123b of a second light guiding block 124b of the light guide plate 120b, and a portion of the lower surface 123b of the light guide plate 120b located on the second light guiding block 124b is a rough surface so that there is a first rough interface R1' between the first light adjusting layer 150b and the light guide plate 120b. Here, the average center line roughness (Ra) of the rough surface is in a range of 1 μm to 500 μm. The first light adjusting layer 150b is a light absorbing layer, wherein the light absorbing layer is, for example, a dielectric film layer, a color plastic material layer such as a black PET layer, or a color coating layer such as a black coating layer. The light absorbing layer has a light absorption rate greater than 60%.

Accordingly, when the point light source 130 enters the light guide plate 120b from a light incident surface 125b of the light guide plate 120b, the first light adjusting layer 150b and the first rough interface R1' adjust (such as absorb and scatter) the light of the point light source 130 in advance to cause the light entering the display panel 110 to be more uniform. Therefore, the display apparatus 100b of the present embodiment has a better display quality, and moreover, a combination design of the light guide plate 120b and the first light adjusting layer 150b effectively reduces the situations where a bright band appears at the light incident surface 125b of the light guide plate 120b.

Figure 3:
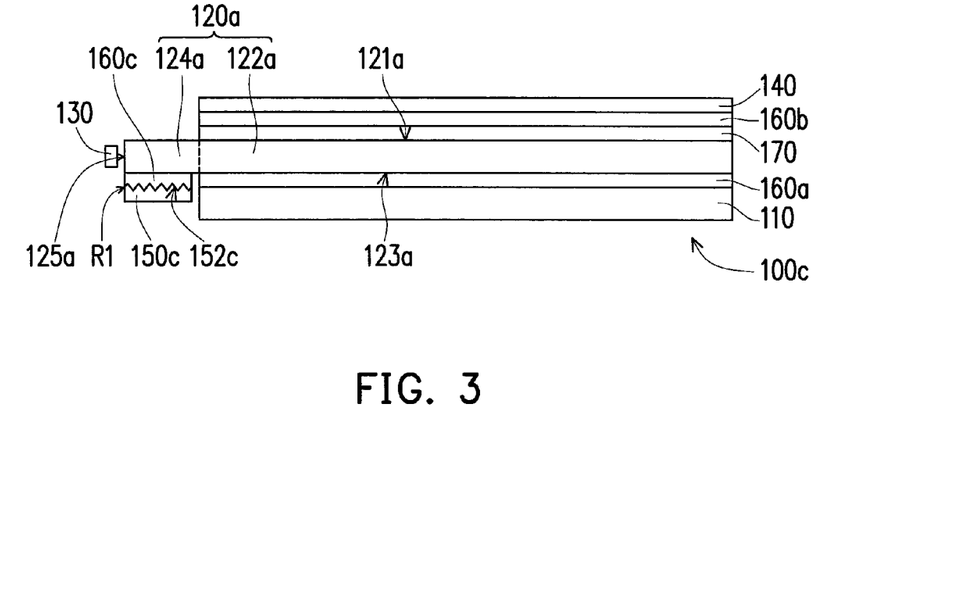
FIG. 3 illustrates a schematic cross-sectional view of a display apparatus according to another embodiment of the invention.

FIG. 3 illustrates a schematic cross-sectional view of a display apparatus according to another embodiment of the invention. Referring to both FIG. 3 and FIG. 1, a display apparatus 100c of the present embodiment is similar to the display apparatus 100a in FIG. 1. However, the two are different mainly in that a first light adjusting layer 150c of the present embodiment is disposed on a lower surface 123a of the second light guiding block 124a of the light guide plate 120a, wherein the first light adjusting layer 150c is a light reflecting layer, and the light reflecting layer is, for example, a dielectric film layer, a color plastic material layer such as a white PET layer, a color coating layer such as a white coating layer or a metal layer. The light reflecting layer has a light reflection rate greater than 60%. Moreover, a surface of the first light adjusting layer 150c facing the light guide plate 120a is a rough surface 152c so that there is the first rough interface R1 between the first light adjusting layer 150c and the light guide plate 120a.

Accordingly, when the point light source 130 enters the light guide plate 120a from the light incident surface 125a of the light guide plate 120a, the first light adjusting layer 150c and the first rough interface R1 adjust (such as reflect and scatter) the light of the point light source 130 in advance to cause the light entering the display panel 110 to be more uniform. Therefore, the display apparatus 100c of the present embodiment has a better display quality, and moreover, a combination design of the light guide plate 120a and the first light adjusting layer 150c effectively reduces the situations where a bright band appears at the light incident surface 125a of the light guide plate 120a.

Figure 4:
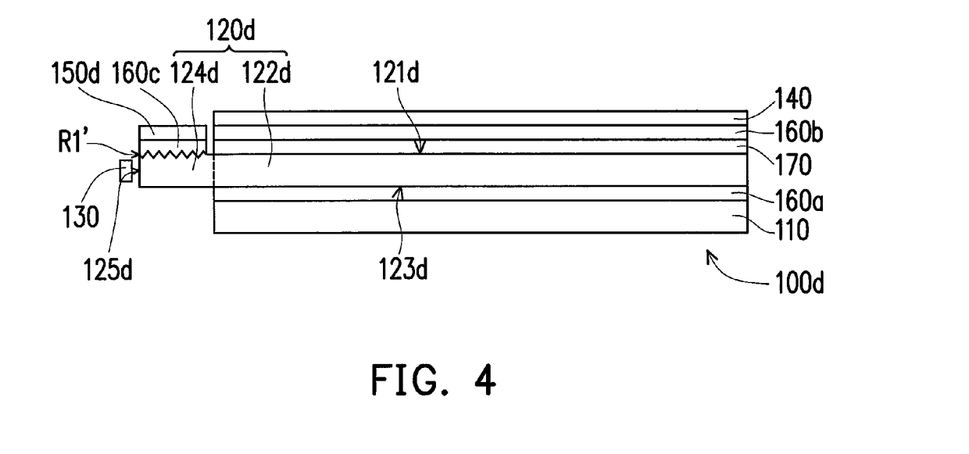
FIG. 4 illustrates a schematic cross-sectional view of a display apparatus according to another embodiment of the invention.

FIG. 4 illustrates a schematic cross-sectional view of a display apparatus according to another embodiment of the invention. Referring to both FIG. 4 and FIG. 2, a display apparatus 100d of the present embodiment is similar to the display apparatus 100b in FIG. 2. However, the two are different mainly in that a first light adjusting layer 150d of the present embodiment is disposed on an upper surface 121d of a second light guiding block 124d of a light guide plate 120d, wherein the first light adjusting layer 150d is a light reflecting layer, and the light reflecting layer is, for example, a dielectric film layer, a color plastic material layer such as a white PET layer, a color coating layer such as a white coating layer or a metal layer. The light reflecting layer has a light reflection rate greater than 60%. Moreover, a portion of the upper surface 121d of the light guide plate 120d located on the second light guiding block 124d is a rough surface so that there is the first rough interface R1' between the first light adjusting layer 150d and the light guide plate 120d. Here, the average center line roughness (Ra) of the rough surface is in a range of 1 μm to 500 μm.

Accordingly, when the point light source 130 enters the light guide plate 120d from a light incident surface 125d of the light guide plate 120d, the first light adjusting layer 150d and the first rough interface R1' adjust (such as reflect and scatter) the light of the point light source 130 in advance to cause the light entering the display panel 110 to be more uniform. Therefore, the display apparatus 100d of the present embodiment has a better display quality, and moreover, a combination design of the light guide plate 120d and the first light adjusting layer 150d effectively reduces the situations where a bright band appears at the light incident surface 125d of the light guide plate 120d.

Figure 5:
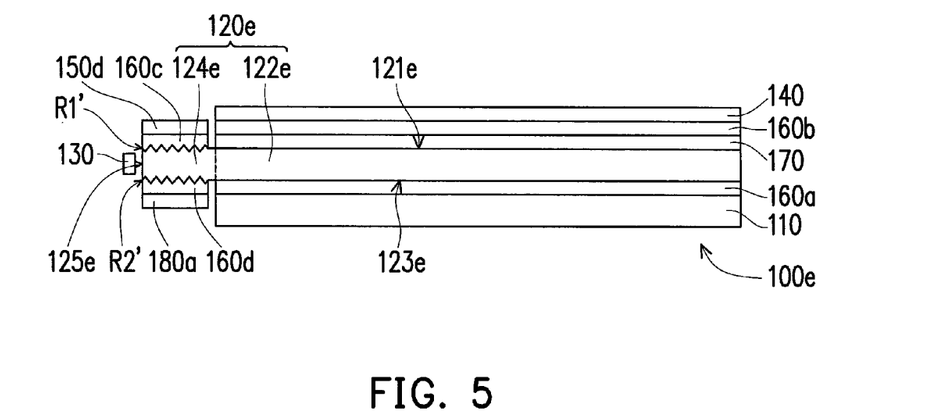
FIG. 5 illustrates a schematic cross-sectional view of a display apparatus according to another embodiment of the invention.

FIG. 5 illustrates a schematic cross-sectional view of a display apparatus according to another embodiment of the invention. Referring to both FIG. 5 and FIG. 4, a display apparatus 100e of the present embodiment is similar to the display apparatus 100d in FIG. 4. However, the two are different mainly in that the display apparatus 100e of the present embodiment further includes a second light adjusting layer 180a disposed on a second light guiding block 124e of a light guide plate 120e. The first light adjusting layer 150d is located on an upper surface 121e of the light guide plate 120e, and the second light adjusting layer 180a is located on a lower surface 123e of the light guide plate 120e. Here, the second light adjusting layer 180a is a light reflecting layer, wherein the light reflecting layer is, for example, a dielectric film layer, a color plastic material layer such as a white PET layer, a color coating layer such as a white coating layer or a metal layer. The light reflecting layer has a light reflection rate greater than 60%. Moreover, a portion of the lower surface 123e of the light guide plate 120e located on the second light guiding block 124e is a rough surface so that there is a second rough interface R2' between the second light adjusting layer 180a and the light guide plate 120e. In addition, the display apparatus 100e further includes a fourth adhesive layer 160d, wherein the fourth adhesive layer 160d is disposed between the second light adjusting layer 180a and the light guide plate 120e to attach and fix the second light adjusting layer 180a onto the light guide plate 120e.

When the point light source 130 enters the light guide plate 120e from a light incident surface 125e of the light guide plate 120e, the first light adjusting layer 150d, the second light adjusting layer 180a, the first rough interface R1' and the second rough interface R2' adjust (such as reflect and scatter) the light of the point light source 130 in advance to cause the light entering the display panel 110 to be more uniform. Therefore, the display apparatus 100e of the present embodiment has a better display quality, and moreover, a combination design of the light guide plate 120e, the first light adjusting layer 150d and the second light adjusting layer 180a effectively reduces the situations where a bright band appears at the light incident surface 125e of the light guide plate 120e.

Figure 6:
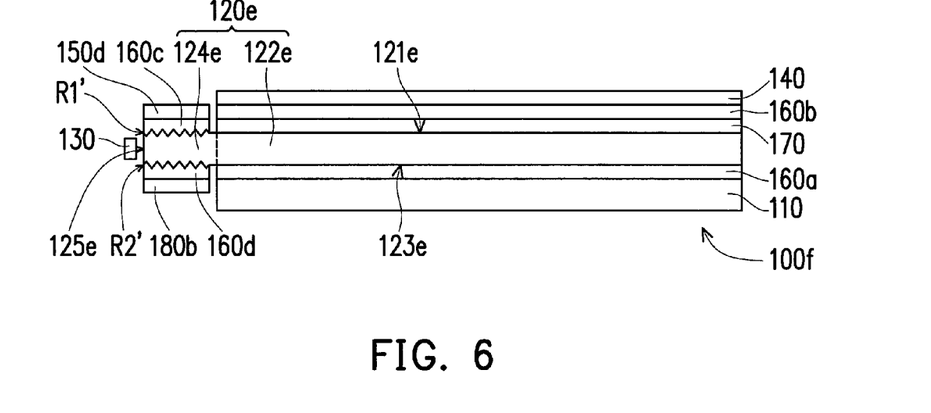
FIG. 6 illustrates a schematic cross-sectional view of a display apparatus according to another embodiment of the invention.

FIG. 6 illustrates a schematic cross-sectional view of a display apparatus according to another embodiment of the invention. Referring to both FIG. 6 and FIG. 5, a display apparatus 100f of the present embodiment is similar to the display apparatus 100e in FIG. 5. However, the two are different mainly in that a second light adjusting layer 180b of the present embodiment is a light absorbing layer, and the light absorbing layer is, for example, a dielectric film layer, a color plastic material layer such as a black PET layer, or a color coating layer such as a black coating layer. The light absorbing layer has a light absorption rate greater than 60%.

When the point light source 130 enters the light guide plate 120e from the light incident surface 125e of the light guide plate 120e, the first light adjusting layer 150d, the second light adjusting layer 180b, the first rough interface R1' and the second rough interface R2' adjust (such as reflect, absorb and scatter) the light of the point light source 130 in advance to cause the light entering the display panel 110 to be more uniform. Therefore, the display apparatus 100f of the present embodiment has a better display quality, and moreover, a combination design of the light guide plate 120e, the first light adjusting layer 150d and the second light adjusting layer 180b effectively reduces the situations where a bright band appears at the light incident surface 125e of the light guide plate 120e.

Figure 7:
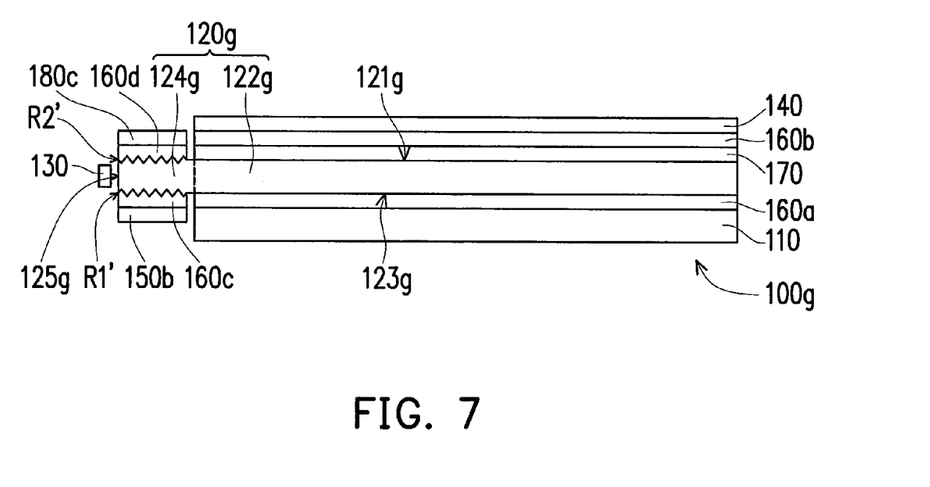
FIG. 7 illustrates a schematic cross-sectional view of a display apparatus according to another embodiment of the invention.

FIG. 7 illustrates a schematic cross-sectional view of a display apparatus according to another embodiment of the invention. Referring to both FIG. 7 and FIG. 2, a display apparatus 100g of the present embodiment is similar to the display apparatus 100b in FIG. 2. However, the two are different mainly in that the display apparatus 100g of the present embodiment further includes a second light adjusting layer 180c disposed on a second light guiding block 124g of a light guide plate 120g. The first light adjusting layer 150b is located on a lower surface 123g of the guide plate 120g, and the second light adjusting layer 180c is located on an upper surface 121g of the light guide plate 120g. Here, the second light adjusting layer 180c is a light absorbing layer, wherein the light absorbing layer is, for example, a dielectric film layer, a color plastic material layer such as a black PET layer, or a color coating layer such as a black coating layer. The light absorbing layer has a light absorption rate greater than 60%. Moreover, a portion of the upper surface 121g of the light guide plate 120g located on the second light guiding block 124g is a rough surface so that there is the second rough interface R2' between the second light adjusting layer 180c and the light guide plate 120g. In addition, the display apparatus 100g further includes the fourth adhesive layer 160d, wherein the fourth adhesive layer 160d is disposed between the second light adjusting layer 180c and the light guide plate 120g to attach and fix the second light adjusting layer 180c onto the light guide plate 120g.

When the point light source 130 enters the light guide plate 120g from the light incident surface 125g of the light guide plate 120g, the first light adjusting layer 150b, the second light adjusting layer 180c, the first rough interface R1' and the second rough interface R2' adjust (such as absorb and scatter) the light of the point light source 130 in advance to cause the light entering the display panel 110 to be more uniform. Therefore, the display apparatus 100g of the present embodiment has a better display quality, and moreover, a combination design of the light guide plate 120g, the first light adjusting layer 150b and the second light adjusting layer 180c effectively reduces the situations where a bright band appears at the light incident surface 125g of the light guide plate 120g.

Figure 8:
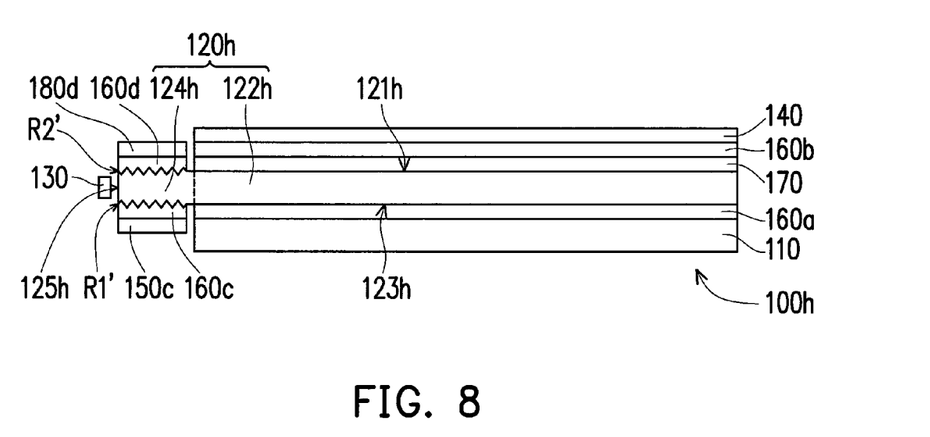
FIG. 8 illustrates a schematic cross-sectional view of a display apparatus according to another embodiment of the invention.

FIG. 8 illustrates a schematic cross-sectional view of a display apparatus according to another embodiment of the invention. Referring to both FIG. 8 and FIG. 2, a display apparatus 100h of the present embodiment is similar to the display apparatus 100b in FIG. 2. However, the two are different mainly in that the display apparatus 100h of the present embodiment further includes a second light adjusting layer 180d disposed on a second light guiding block 124h of a light guide plate 120h. The first light adjusting layer 150c is a light reflecting layer, and the light reflecting layer is, for example, a dielectric film layer, a color plastic material layer such as a white PET layer, a color coating layer such as a white coating layer or a metal layer. The light reflecting layer has a light reflection rate greater than 60%. The first light adjusting layer 150c is located on a lower surface 123h of the light guide plate 120h, and the second light adjusting layer 180d is located on an upper surface 121h of the light guide plate 120h. Here, the second light adjusting layer 180d is a light absorbing layer, wherein the light absorbing layer is, for example, a dielectric film layer, a color plastic material layer such as a black PET layer, or a color coating layer such as a black coating layer. The light absorbing layer has a light absorption rate greater than 60%. Moreover, a portion of the upper surface 121h of the light guide plate 120h located on the second light guiding block 124h is a rough surface so that there is the second rough interface R2' between the second light adjusting layer 180d and the light guide plate 120h. In addition, the display apparatus 100h further includes the fourth adhesive layer 160d, wherein the fourth adhesive layer 160d is disposed between the second light adjusting layer 180d and the light guide plate 120h to attach and fix the second light adjusting layer 180d onto the light guide plate 120h.

When the point light source 130 enters the light guide plate 120h from a light incident surface 125h of the light guide plate 120h, the first light adjusting layer 150c, the second light adjusting layer 180d, the first rough interface R1' and the second rough interface R2' adjust (such as reflect, absorb and scatter) the light of the point light source 130 in advance to cause the light entering the display panel 110 to be more uniform. Therefore, the display apparatus 100h of the present embodiment has a better display quality, and moreover, a combination design of the light guide plate 120h, the first light adjusting layer 150c and the second light adjusting layer 180d effectively reduces the situations where a bright band appears at the light incident surface 125h of the light guide plate 120h.

Figure 9:
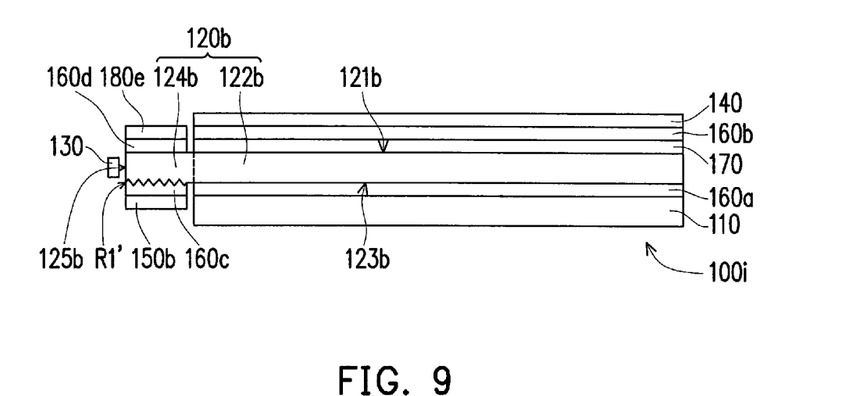
FIG. 9 illustrates a schematic cross-sectional view of a display apparatus according to another embodiment of the invention.

FIG. 9 illustrates a schematic cross-sectional view of a display apparatus according to another embodiment of the invention. Referring to both FIG. 9 and FIG. 2, a display apparatus 100i of the present embodiment is similar to the display apparatus 100b in FIG. 2. However, the two are different mainly in that the display apparatus 100i of the present embodiment further includes a second light adjusting layer 180e disposed on the second light guiding block 124b of the light guide plate 120b. The first light adjusting layer 150b is located on the lower surface 123b of the light guide plate 120b, and the second light adjusting layer 180e is located on the upper surface 121b of the light guide plate 120b. Here, the second light adjusting layer 180e is a light absorbing layer or a light reflecting layer, wherein the light absorbing layer is, for example, a dielectric film layer, a color plastic material layer such as a black PET layer, or a color coating layer such as a black coating layer. The light absorbing layer has a light absorption rate greater than 60%. The light reflecting layer is, for example, a dielectric film layer, a color plastic material layer such as a white PET layer, a color coating layer such as a white coating layer or a metal layer. The light reflecting layer has a light reflection rate greater than 60%. In addition, the display apparatus 100i further includes the fourth adhesive layer 160d, wherein the fourth adhesive layer 160d is disposed between the second light adjusting layer 180e and the light guide plate 120b to attach and fix the second light adjusting layer 180e onto the light guide plate 120b.

When the point light source 130 enters the light guide plate 120b from the light incident surface 125b of the light guide plate 120b, the first light adjusting layer 150b, the second light adjusting layer 180e and the first rough interface R1' adjust (absorb and scatter; or absorb, reflect and scatter) the light of the point light source 130 in advance to cause the light entering the display panel 110 to be more uniform. Therefore, the display apparatus 100i of the present embodiment has a better display quality, and moreover, a combination design of the light guide plate 120b, the first light adjusting layer 150b and the second light adjusting layer 180e effectively reduces the situations where a bright band appears at the light incident surface 125b of the light guide plate 120b.

Figure 10:
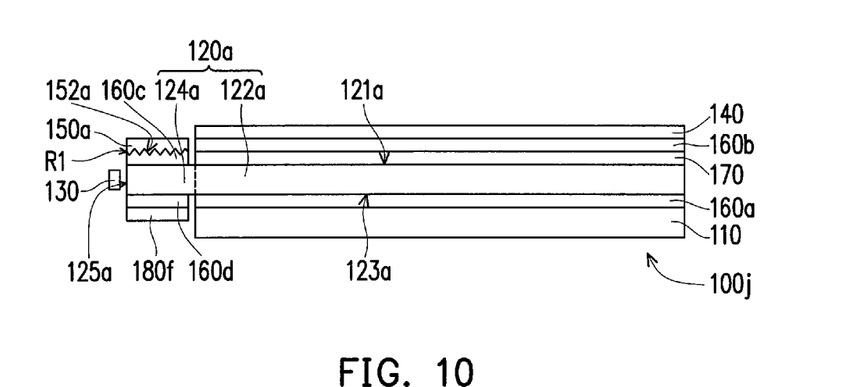
FIG. 10 illustrates a schematic cross-sectional view of a display apparatus according to another embodiment of the invention.

FIG. 10 illustrates a schematic cross-sectional view of a display apparatus according to another embodiment of the invention. Referring to both FIG. 10 and FIG. 1, a display apparatus 100j of the present embodiment is similar to the display apparatus 100a in FIG. 1. However, the two are different mainly in that the display apparatus 100j of the present embodiment further includes a second light adjusting layer 180f disposed on the second light guiding block 124a of the light guide plate 120a. The first light adjusting layer 150a is located on the upper surface 121a of the light guide plate 120a, and the second light adjusting layer 180f is located on the lower surface 123a of the light guide plate 120a. Here, the second light adjusting layer 180f is a light absorbing layer or a light reflecting layer, wherein the light absorbing layer is, for example, a dielectric film layer, a color plastic material layer such as a black PET layer, or a color coating layer such as a black coating layer. The light absorbing layer has a light absorption rate greater than 60%. The light reflecting layer is, for example, a dielectric film layer, a color plastic material layer such as a white PET layer, a color coating layer such as a white coating layer or a metal layer. The light reflecting layer has a light reflection rate greater than 60%. In addition, the display apparatus 100j further includes the fourth adhesive layer 160d, wherein the fourth adhesive layer 160d is disposed between the second light adjusting layer 180f and the light guide plate 120a to attach and fix the second light adjusting layer 180f onto the light guide plate 120a.

When the point light source 130 enters the light guide plate 120a from the light incident surface 125a of the light guide plate 120a, the first light adjusting layer 150a, the second light adjusting layer 180f and the first rough interface R1' adjust (absorb and scatter; or absorb, reflect and scatter) the light of the point light source 130 in advance to cause the light entering the display panel 110 to be more uniform. Therefore, the display apparatus 100j of the present embodiment has a better display quality, and moreover, a combination design of the light guide plate 120a, the first light adjusting layer 150a and the second light adjusting layer 180f effectively reduces the situations where a bright band appears at the light incident surface 125a of the light guide plate 120a.

It is worth mentioning that in other embodiments not illustrated herein, a surface of the second light adjusting layer facing the light guide plate may be a rough surface so that there is the second rough interface between the second light adjusting layer and the light guide plate. Said embodiment still belongs to a technical means adoptable in the invention and falls within the protection scope of the invention.

In summary, the light guide plate of the invention has the second light guiding block extending outside the display panel, and the light adjusting layer is located on the second light guiding block. Accordingly, when the point light source enters the light guide plate from the light incident surface of the light guide plate, the light adjusting layer adjusts (such as absorb and/or reflect) the light of the point light source in advance to cause the light entering the display panel to be more uniform. Moreover, since there is the rough interface between the light adjusting layer and the light guide plate, the light from the point light source entering the light guide plate is effectively scattered to cause the light entering the display panel to be more uniform. Therefore, the display apparatus of the invention has a better display quality, and moreover, the combination design of the light guide plate and the light adjusting layer effectively reduces the situations where an apparent bright band appears at a side of the light guide plate close to the point light source (i.e. the light incident surface).

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:
1. A display apparatus, comprising:
a display panel;
a light guide plate disposed above the display panel and having an upper surface, an opposite lower surface, a light incident surface connecting the upper surface and the lower surface, a first light guiding block and a second light guiding block, wherein the display panel is disposed corresponding to the first light guiding block, the second light guiding block extends outside the display panel, and a portion of the upper surface located on the first light guiding block is an even surface;

a plurality of point light sources disposed beside the light incident surface of the light guide plate;

a passivation layer disposed above the light guide plate, wherein the first light guiding block of the light guide plate is located between the passivation layer and the display panel; and a first light adjusting layer disposed on the second light guiding block of the light guide plate, and located on the upper surface or the lower surface of the light guide plate, wherein there is a first rough interface between the first light adjusting layer and the light guide plate.

2. The display apparatus as claimed in claim 1, wherein the display panel comprises a reflective display panel.

3. The display apparatus as claimed in claim 1, wherein each of the point light sources is a light emitting diode.

4. The display apparatus as claimed in claim 1, wherein the first light adjusting layer comprises a light absorbing layer or a light reflecting layer.

5. The display apparatus as claimed in claim 4, wherein the light absorbing layer comprises a dielectric film layer, a black plastic material layer or a black coating layer, and the light absorbing layer has a light absorption rate greater than 60%.

6. The display apparatus as claimed in claim 4, wherein the light reflecting layer comprises a dielectric film layer, a white plastic material layer, a white coating layer or a metal layer, and the light reflecting layer has a light reflection rate greater than 60%.

7. The display apparatus as claimed in claim 1, wherein a surface of the first light adjusting layer facing the light guide plate is a rough surface so that there is the first rough interface between the first light adjusting layer and the light guide plate.

8. The display apparatus as claimed in claim 1, wherein a portion of the upper surface or the lower surface of the light guide plate located on the second light guiding block is a rough surface so that there is the first rough interface between the first light adjusting layer and the light guide plate.

9. The display apparatus as claimed in claim 1, further comprising:
a first adhesive layer disposed between the display panel and the light guide plate.

10. The display apparatus as claimed in claim 1, further comprising:
a second adhesive layer disposed between the light guide plate and the passivation layer.

11. The display apparatus as claimed in claim 1, further comprising:
an optical film disposed between the light guide plate and the passivation layer.

12. The display apparatus as claimed in claim 1, further comprising:
a third adhesive layer disposed between the first light adjusting layer and the light guide plate.

13. The display apparatus as claimed in claim 1, further comprising:
a second light adjusting layer disposed on the second light guiding block of the light guide plate, wherein one of the first light adjusting layer and the second light adjusting layer is disposed on the upper surface of the light guide plate and the other is disposed on the lower surface of the light guide plate.

14. The display apparatus as claimed in claim 13, wherein the second light adjusting layer comprises a light absorbing layer or a light reflecting layer.

15. The display apparatus as claimed in claim 14, wherein the light absorbing layer comprises a dielectric film layer, a black plastic material layer or a black coating layer, and the light absorbing layer has a light absorption rate greater than 60%.

16. The display apparatus as claimed in claim 14, wherein the light reflecting layer comprises a dielectric film layer, a white plastic material layer, a white coating layer or a metal layer, and the light reflecting layer has a light reflection rate greater than 60%.

17. The display apparatus as claimed in claim 13, wherein there is a second rough interface between the second light adjusting layer and the light guide plate.

18. The display apparatus as claimed in claim 17, wherein a surface of the second light adjusting layer facing the light guide plate is a rough surface so that there is the second rough interface between the second light adjusting layer and the light guide plate.

19. The display apparatus as claimed in claim 17, wherein a portion of the upper surface or the lower surface of the light guide plate located on the second light guiding block is a rough surface so that there is the second rough interface between the second light adjusting layer and the light guide plate.

20. The display apparatus as claimed in claim 13, further comprising:
a fourth adhesive layer disposed between the second light adjusting layer and the light guide plate.

* * * * *